(12) United States Patent
Khoo et al.

(10) Patent No.: US 10,325,826 B1
(45) Date of Patent: Jun. 18, 2019

(54) SUBSTRATE WITH RESERVOIR FOR DIE ATTACH ADHESIVE

(71) Applicant: NXP USA, INC., Austin, TX (US)

(72) Inventors: Ly Hoon Khoo, Bandar Puteri Klang (MY); Chin Teck Siong, Sungai Buloh (MY); Vanessa Wyn Jean Tan, Kuala Lumpur (MY)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/964,079

(22) Filed: Apr. 27, 2018

(51) Int. Cl.
*H01L 23/498* (2006.01)
*H01L 23/13* (2006.01)
*H01L 23/31* (2006.01)
*H01L 21/48* (2006.01)
*H01L 23/00* (2006.01)

(52) U.S. Cl.
CPC .......... *H01L 23/13* (2013.01); *H01L 23/3128* (2013.01); *H01L 23/49827* (2013.01); *H01L 23/49838* (2013.01); *H01L 24/06* (2013.01); *H01L 24/32* (2013.01); *H01L 24/48* (2013.01); *H01L 24/73* (2013.01); *H01L 21/4803* (2013.01); *H01L 24/29* (2013.01); *H01L 24/45* (2013.01); *H01L 2224/04042* (2013.01); *H01L 2224/26175* (2013.01); *H01L 2224/2919* (2013.01); *H01L 2224/32225* (2013.01); *H01L 2224/45144* (2013.01); *H01L 2224/45147* (2013.01); *H01L 2224/48091* (2013.01); *H01L 2224/48106* (2013.01); *H01L 2224/48235* (2013.01); *H01L 2224/73265* (2013.01); *H01L 2924/0665* (2013.01); *H01L 2924/14* (2013.01)

(58) Field of Classification Search
CPC ............... H01L 23/13; H01L 23/49838; H01L 23/49827; H01L 23/3128; H01L 24/73; H01L 24/48; H01L 24/32; H01L 24/06; H01L 24/29; H01L 21/4803; H01L 2924/14; H01L 24/45; H01L 2224/04042; H01L 2224/73265; H01L 2224/48235; H01L 2224/45147; H01L 2224/48091; H01L 2224/32225; H01L 2224/2919; H01L 2224/45144; H01L 2924/0665; H01L 2224/26175; H01L 2224/48106
USPC ........................................................ 257/668
See application file for complete search history.

(56) References Cited

U.S. PATENT DOCUMENTS

| | | |
|---|---|---|
| 5,409,863 A | 4/1995 | Newman |
| 6,013,535 A | 1/2000 | Moden et al. |
| 6,498,055 B2 | 12/2002 | Fukuda et al. |
| 6,734,596 B1 | 6/2004 | Halahan et al. |
| 6,753,205 B2 | 6/2004 | Halahan |
| 6,759,307 B1 | 7/2004 | Yang |
| 7,812,432 B2 | 10/2010 | Hou et al. |
| 8,198,143 B2 | 6/2012 | Eu et al. |

(Continued)

*Primary Examiner* — Caleen O Sullivan
(74) *Attorney, Agent, or Firm* — Charles E. Bergere

(57) ABSTRACT

A substrate having a die attach area for receiving a semiconductor die includes a recessed area for receiving die attach adhesive. The recessed area prevents die attach adhesive from bleeding into the surrounding area and onto substrate connection sites, where it could compromise a wire bond formed on such a connection site. The recessed area has a zig-zag pattern, which allows for sufficient amounts of adhesive to be used to securely attach the die to the substrate, yet does not enlarge the recessed area such that the package size may be adversely affected.

17 Claims, 1 Drawing Sheet

(56) References Cited

U.S. PATENT DOCUMENTS

| | | |
|---|---|---|
| 2006/0035414 A1* | 2/2006 | Park .................... H01L 21/561 438/124 |
| 2007/0116862 A1 | 5/2007 | Furtaw et al. |
| 2015/0001697 A1 | 1/2015 | Heng |

* cited by examiner

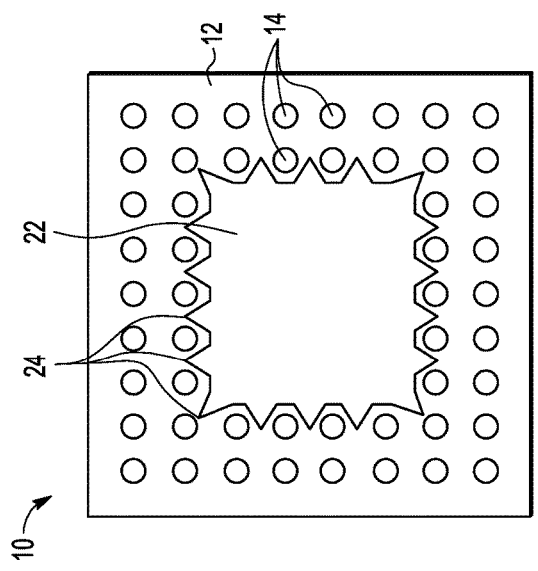
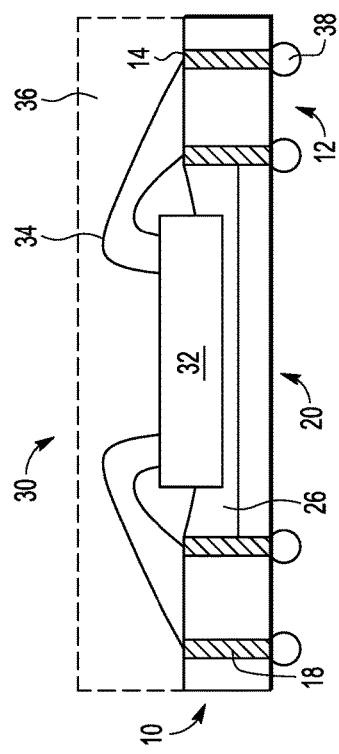
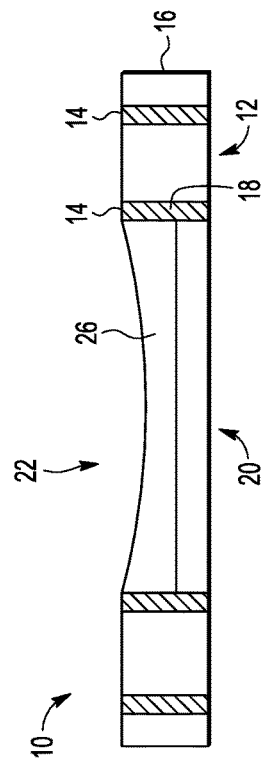

SUBSTRATE WITH RESERVOIR FOR DIE ATTACH ADHESIVE

BACKGROUND

The present invention generally relates to semiconductor devices and semiconductor device assembly, and, more particularly, to a substrate having a die attach area with a reservoir for receiving die attach adhesive.

Semiconductor dies are packaged before being attached to a printed circuit board (PCB) or other devices. The packaging protects the integrated circuit die from being contaminated, such as by water, dust or moisture. The packaging process includes attaching the die to a substrate or lead frame and electrically connecting bond pads on the die with corresponding electrical connection sites, e.g., lead fingers, such as with bond wires. The substrate electrical connection sites are electrically connected to I/O pads or other externally connectable pads, such as solder balls.

Before the die bond pads are electrically connected to the substrate connection sites, the die is mechanically attached to the substrate. Typically, a conductive paste or an epoxy adhesive is used to attach a die to a substrate. However, epoxy adhesive, even if filled with particles, has a tendency to spread or "bleed" away from the adhesion area (die attach area). Any filled epoxy or epoxy resin that flows onto a substrate connection site contaminates the site, which may compromise the ensuing wire bond.

Various methods for reducing resin bleed have been developed. For example, the substrate surface may have a recess at the point of attachment of the die, such that the die and adhesive will be recessed below the adjoining areas of the substrate where electrical bonding sites are located. U.S. Pat. No. 5,409,863 discloses a method for controlling adhesive spread during a die-attach process using a low-profile barrier, such as a solder mask ring, formed at a die attach area of a substrate. The barrier surrounds the die attach area, preventing the spread of adhesive resin onto the adjacent bonding sites on the substrate. While this method seems to work well, if the barrier is not sufficiently spaced from the die attach area, it may not permit enough adhesive to be used to securely attach the die to the substrate. On the other hand, spacing the barrier too far from the die attach area leads to usage of more adhesive than necessary.

It also has been suggested to treat the area surrounding the die attach area with fluorinated coupling agents or other surfactants to render the areas non-wettable to the adhesive resin. However, while these chemicals may prevent resin from adhering to areas surrounding the die attach area, there still may be adhesive bleed-off, resulting in wasted adhesive. Moreover, these processes must be carefully controlled and are time consuming and relatively expensive. Further, as IC complexity increases and more bond sites are needed, a large die attach area, made larger by having a barrier surrounding area, can adversely increase package size.

Accordingly, it would be desirable to provide a substrate that prevents die attach adhesive from spreading onto adjacent wire bond sites when assembling an integrated circuit package, yet does not increase overall package size nor unduly limit the amount of die attach adhesive used to attach the die to the substrate.

BRIEF DESCRIPTION OF THE DRAWINGS

So that the manner in which the features of the present invention can be understood in detail, a detailed description of the invention is provided below with reference to embodiments, some of which are illustrated in the appended drawings. It is to be noted that the appended drawings illustrate only typical embodiments of the invention and are therefore not to be considered limiting of its scope, for the invention may admit to other equally effective embodiments. The drawings are for facilitating an understanding of the invention and thus are not necessarily drawn to scale, and some features may be omitted in order to highlight other features of the invention so that the invention may be more clearly understood. Advantages of the subject matter claimed will become apparent to those skilled in the art upon reading this description in conjunction with the accompanying drawings, in which like reference numerals have been used to designate like elements, and in which:

FIG. 1 is an enlarged top plan view of a substrate in accordance with an embodiment of the present invention;

FIG. 2 is an enlarged cross-sectional side view of the substrate of FIG. 1, including a die attach adhesive; and FIG. 3 is an enlarged cross-sectional side view of a semiconductor device assembled using the substrate of FIG. 1.

DETAILED DESCRIPTION

In one embodiment, the present invention provides a substrate for use in packaging a semiconductor integrated circuit die. The substrate comprises a first area having a first surface including a plurality of substrate electrical connection sites, and a second area having a second surface contiguous with the first surface of the first area. A cavity is formed in the second area for receiving an integrated circuit die. The cavity has a zig-zag shaped outer perimeter for retaining a die attach adhesive disposed within the cavity.

In another embodiment, the present invention provides an integrated circuit device, comprising a substrate, an integrated circuit die, a die attach adhesive, and a plurality of bond wires. The substrate has a first area with a first surface including a plurality of substrate electrical connection sites, a second area with a second surface contiguous with the first surface of the first area, and a cavity formed in the second area. The cavity has a zig-zag shaped outer perimeter. The integrated circuit die is disposed within the cavity. A plurality of die bonding pads on a top surface of the die are electrically connected to circuitry formed within the die. The die attach adhesive disposed within the cavity and secures the die to the second surface. The bond wires electrically connect respective ones of the substrate electrical connection sites with the die bonding pads. The die attach adhesive is retained within the cavity by the zig-zag shaped outer perimeter thereof. In one embodiment, the substrate electrical connection sites surround the cavity, and the zig-zag pattern has projecting portions that extend between adjacent ones of the substrate electrical connection sites.

Referring now to FIGS. 1 and 2, a top plan view and a side cross-sectional view of an embodiment of a substrate 10 for use in packaging a semiconductor integrated circuit die, in accordance with an embodiment of the present invention, are shown. The substrate 10 comprises a first area 12 having a first surface including a plurality of substrate electrical connection sites 14. The substrate 10 may comprise one or more circuit layers. For example, in one embodiment, the substrate 10 comprises a single layer of dielectric material 16 having a plurality of electrically conductive vias 18 that extend from a top surface of the dielectric material 16 to a bottom surface thereof. In other embodiments, the substrate 10 may include a redistribution layer (RDL) instead of just conductive vias 18. The conductive vias 18 may comprise vias filled with a conductive material such as copper, as is known in the art. In the embodiment shown, the vias 18 are formed as an array except that there is an area in the center of the array that has no vias—this is the area where an integrated circuit die is received, also known as a die attach area. In some embodiments, the die attach area includes conductive vias that are connected to a RDL.

The substrate 10 has a second area 20 having a second surface contiguous with the first surface of the first area 12. The second area 20 is a die attach area. In the presently preferred embodiment, a cavity 22 is formed in the second area 20 for receiving an integrated circuit die. The cavity 22 is sized (L×W) to receive an integrated circuit die of a predetermined size, where the length and width of the die are less than the less and width of the cavity. Thus, an area of the cavity 22 is greater than an area of the integrated circuit die to be received therein. In the presently preferred embodiment, the cavity 22 has a depth that is less than a thickness of the integrated circuit die to be received therein. However, in other embodiments, the cavity has a depth that is equal to greater than a thickness of the integrated circuit die to be received therein.

In order to maximize an area of the cavity 22 without increasing the overall size of the substrate 10, the cavity 22 has a zig-zag shaped outer perimeter, as shown in FIG. 1. The substrate electrical connection sites 14 surround the cavity 22, and the zig-zag pattern has projecting portions 24 that extend between adjacent ones of the substrate electrical connection sites 14.

The cavity 22 may be formed by etching without adversely effecting any underlying circuitry (e.g., routing), if any, during etching using a photoresist. In the presently preferred embodiment, the cavity 22 is formed by etching off a predefined portion of the substrate using a photoresist mask and to a predetermined depth, which preferably is at least 0.025-0.050 mm.

A die attach adhesive 26 is dispensed into the cavity 22 for securing an integrated circuit die within the cavity 22. The cavity 22 retains the die attach adhesive 26 so that the die attach adhesive 26 does not bleed onto any of the plurality of substrate electrical connection sites 14. The die attach adhesive 26 may comprise a conductive paste, a high modulus epoxy-based die attach adhesive, or for larger dies, a low modulus epoxy-based adhesive. In an alternative embodiment, the die attach adhesive 26 comprises a B-stage material that is disposed in the cavity prior to providing the substrate 10 to an integrated circuit device assembly manufacturer. That is, the substrate 10 with the adhesive 26 is manufactured in one place and then shipped to another factory where integrated circuit devices are assembled. In such a case, it is best not to wait more than a few days before using the substrate 10 or the B-stage material may be compromised. In another embodiment, the die attach adhesive 26 comprises a thick film (DAF) or a conductive-DAF (CDAF) that is attached to a bottom surface of a die and when the die is placed in the cavity 22, the DAF is heated such that it changes to a liquid state and fills the cavity. In yet another embodiment, the adhesive 26 comprises a liquid form of an epoxy resin that is dispensed into the cavity 22 just prior to placing the die within the cavity 22. The adhesive 26 then secures a bottom (non-active) surface of the die to the second area 20 of the substrate 10.

Referring now to FIG. 3, a cross-sectional side view of a semiconductor device 30 in accordance with an embodiment of the present invention. The semiconductor device 30 includes the substrate 10 shown in FIGS. 1 and 2, and the die attach adhesive 26. An integrated circuit die 32 is disposed within the cavity 22 and the die 32 is secured therein by the adhesive 26.

The plurality of substrate electrical connection sites 14 surround the cavity 22, and the zig-zag pattern has the projecting portions 24 that extend between adjacent ones of the plurality of substrate electrical connection sites 14. The die attach adhesive 26 is retained within the cavity 22 by the zig-zag shaped outer perimeter thereof. A meniscus may be formed at the side walls of the cavity 22. However, since an area of the cavity 22 is greater than an area of the integrated circuit die 32, the cavity 22 retains the die attach adhesive 26 therein so that the die attach adhesive 26 does not bleed onto any of the plurality of substrate electrical connection sites 14.

In the presently preferred embodiment, a depth of the cavity 22 is less than a thickness of the integrated circuit die 32, as shown in FIG. 3. However, in alternative embodiments, the depth of the cavity may be equal to or even greater than a thickness of the integrated circuit die 32.

The integrated circuit die 32 has a plurality of die bonding pads on an active surface thereof that are electrically connected to circuitry formed within the die 32. The die bonding pads are electrically connected to respective ones of the substrate electrical connection sites 14 with bond wires 34. The bond wires 34 may comprise copper or gold wires, for example, and are bonded to the connection sites 14 and the die bonding pads using commercially available wire bonding machines.

A molding compound 36 covers the first and second areas 12 and 20 of the substrate 10, the integrated circuit die 32, and the bond wires 34. In one embodiment, the molding compound comprises an epoxy-resin composition, for example a C-stage plastic material that is fully cured (i.e., Resite). That is, the molding compound 36 is cured to be physically hard, so that the die 32, bond wires 34, and wire bonds covered by the molding compound 36 are protected from potential environmental influences like moisture and dust, as well as mechanical damage. The molding compound 36 may be formed over the die 32 using known methods, such as transfer molding.

Conductive balls 38 may be attached to the exposed ends of the conductive vias 18. The balls 38 allow the device 30 to be attached to a printed circuit board (PCB).

Since the cavity has a zig-zag shaped perimeter with points that extend between adjacent substrate connection sites, the size of the cavity is maximized without increasing the area of the substrate, and thus the size of the package. The zig-zag shaped perimeter prevents die attach adhesive from bleeding onto the substrate connection sites.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein.

Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A substrate for use in packaging a semiconductor integrated circuit die, the substrate comprising:
   a first area having a first surface including a plurality of substrate electrical connection sites;
   a second area having a second surface contiguous with the first surface of the first area; and
   a cavity formed in the second area for receiving an integrated circuit die,
   wherein the cavity has a zig-zag shaped outer perimeter for retaining a die attach adhesive disposed within the cavity.

2. The substrate of claim 1, wherein the plurality of substrate electrical connection sites surround the cavity, and the zig-zag pattern has projecting portions that extend between adjacent ones of the plurality of substrate electrical connection sites.

3. The substrate of claim 1, wherein the cavity retains the die attach adhesive so that the die attach adhesive does not bleed onto any of the plurality of substrate electrical connection sites.

4. The substrate of claim 1, wherein an area of the cavity is greater than an area of the integrated circuit die to be received therein.

5. The substrate of claim 1, wherein a depth of the cavity is less than a thickness of the integrated circuit die to be received therein.

6. The substrate of claim 1, wherein a depth of the cavity is equal to a thickness of the integrated circuit die to be received therein.

7. The substrate of claim 1, wherein a depth of the cavity is greater than a thickness of the integrated circuit die to be received therein.

8. The substrate of claim 1, wherein the die attach adhesive comprises a B-stage material that is disposed in the cavity prior to providing the substrate to an integrated circuit device assembly manufacturer.

9. An integrated circuit device, comprising:
   a substrate having a first area with a first surface including a plurality of substrate electrical connection sites, a second area with a second surface contiguous with the first surface of the first area, and a cavity formed in the second area, wherein the cavity has a zig-zag shaped outer perimeter;
   an integrated circuit die disposed within the cavity, the integrated circuit die having a plurality of die bonding pads electrically connected to circuitry formed within the die;
   a die attach adhesive disposed within the cavity for securing the die to the second surface; and
   a plurality of bond wires electrically connecting respective ones of the substrate electrical connection sites with the plurality of die bonding pads,
   wherein the die attach adhesive is retained within the cavity by the zig-zag shaped outer perimeter thereof.

10. The integrated circuit device of claim 9, wherein the plurality of substrate electrical connection sites surround the cavity, and the zig-zag pattern has projecting portions that extend between adjacent ones of the plurality of substrate electrical connection sites.

11. The integrated circuit device of claim 9, wherein the cavity retains the die attach adhesive therein so that the die attach adhesive does not bleed onto any of the plurality of substrate electrical connection sites.

12. The integrated circuit device of claim 9, wherein an area of the cavity is greater than an area of the integrated circuit die received therein.

13. The integrated circuit device of claim 9, wherein a depth of the cavity is less than a thickness of the integrated circuit die received therein.

14. The integrated circuit device of claim 9, wherein a depth of the cavity is equal to a thickness of the integrated circuit die to be received therein.

15. The integrated circuit device of claim 9, wherein a depth of the cavity is greater than a thickness of the integrated circuit die to be received therein.

16. The integrated circuit device of claim 9, wherein the die attach adhesive comprises a B-stage material that is disposed in the cavity prior to providing the substrate to an integrated circuit device assembly manufacturer.

17. The integrated circuit device of claim 9, further comprising a molding compound that covers the first and second surfaces of the substrate, the integrated circuit die, and the bond wires.

* * * * *